(12) United States Patent
Mori

(10) Patent No.: US 8,584,483 B2
(45) Date of Patent: Nov. 19, 2013

(54) SEMICONDUCTOR DEVICE

(75) Inventor: Shogo Mori, Aichi-ken (JP)

(73) Assignee: Kabushiki Kaisha Toyota Jidoshokki, Aichi-Ken (JP)

( * ) Notice: Subject to any disclaimer, the term of this patent is extended or adjusted under 35 U.S.C. 154(b) by 343 days.

(21) Appl. No.: 13/069,933

(22) Filed: Mar. 23, 2011

(65) Prior Publication Data

US 2011/0232316 A1    Sep. 29, 2011

(30) Foreign Application Priority Data

Mar. 29, 2010    (JP) ................................ 2010-075487

(51) Int. Cl.
*F25D 17/04*    (2006.01)
(52) U.S. Cl.
USPC .............................. 62/317; 62/908
(58) Field of Classification Search
USPC ...................... 62/85, 317, 474, 908, 195, 475; 137/140, 147
See application file for complete search history.

(56) References Cited

U.S. PATENT DOCUMENTS

| | | | |
|---|---|---|---|
| 4,364,756 A * | 12/1982 | Clarke et al. ..................... | 96/137 |
| 5,442,015 A | 8/1995 | Kennedy et al. | |
| 5,907,958 A * | 6/1999 | Coates et al. .................... | 62/338 |
| 6,539,745 B1 * | 4/2003 | Harmer et al. ................... | 62/503 |
| 6,669,451 B1 * | 12/2003 | Wall ............................... | 417/313 |
| 6,764,593 B1 * | 7/2004 | Pace ................................ | 210/92 |
| 6,938,437 B2 * | 9/2005 | Velez et al. ...................... | 62/474 |
| 7,195,463 B1 * | 3/2007 | Wall ................................ | 417/53 |
| 7,992,721 B2 * | 8/2011 | McMasters .................... | 210/435 |
| 2010/0193941 A1 | 8/2010 | Mori et al. | |
| 2010/0246139 A1 | 9/2010 | Suzuki et al. | |

FOREIGN PATENT DOCUMENTS

| | | |
|---|---|---|
| JP | 2007-205694 | 8/2007 |
| JP | 2009-156526 | 7/2009 |
| KR | 0183499 | 4/1999 |

OTHER PUBLICATIONS

U.S. Appl. No. 13/070,088 to Shogo Mori et al., filed Mar. 23, 2011.
U.S. Appl. No. 13/070,088 to Shogo Mori et al., which was filed on Mar. 23, 2011.

* cited by examiner

*Primary Examiner* — Mohammad M Ali
(74) *Attorney, Agent, or Firm* — Greenblum & Bernstein, P.L.C.

(57) ABSTRACT

A cooling device includes a refrigerant inlet, a refrigerant outlet, a cooler including therein a refrigerant passage, an introduction tube communicating with the refrigerant inlet and a filter detachably disposed between the refrigerant inlet and the introduction tube.

7 Claims, 5 Drawing Sheets

SEMICONDUCTOR DEVICE

BACKGROUND OF THE INVENTION

The present invention relates generally to a cooling device for an electric device and more specifically to a cooling device having a filter.

An electric device has a cooling device for cooling the electric device by allowing heat generated by a heat generator such as a semiconductor device mounted to the electric device to be radiated. The cooling device includes a cooler that has formed therein a passage by installation of fins in a sealed housing thereof. The cooler is operable to exchange heat generated by the heat generator with refrigerant such as water circulating through the passage, thereby cooling the heat generator.

Generally, a cooler is connected to a radiator and a pump through a tube or a hose for circulating refrigerant. Since refrigerant used for the cooling device is contaminated by foreign particles produced from component parts of the refrigerant circuit and due to the deterioration of walls of such component parts, there is a fear that the passage in the cooler is clogged with the foreign particles. To solve this problem, the cooling device disclosed in Japanese Application Publication 2007-205694 uses a filter for refrigerant to prevent a passage in the cooler from being clogged with foreign particles.

The cooling device disclosed in the above Publication is formed into an integral laminated structure in which an inlet side tube connection plate, a passage-enlarging plate, a filter plate, another passage-enlarging plate, an inlet side passage-restricting plate, a plurality of passage plates and heat transmission plates that are arranged alternately, an outlet side passage-restricting plate, another outlet side passage-enlarging plate and an outlet side tube connection plate are disposed in laminated arrangement in this order. Each heat transfer plate has formed at the center thereof a finned area and a micro passage is formed between any two adjacent finned areas of the heat transfer plates. Foreign particles contained in fluid flowing in from the inlet side tube connection plate are captured by the filter plate. Therefore, the cooling device according to the above Publication can prevent the micro passage formed between any two adjacent finned areas from being clogged with the foreign particles, thus preventing an increase of load of the pump and deterioration of the cooling performance and achieving effective cooling of the heat generator.

Foreign particles that are captured are attached to and deposited on the surface of the filter plate gradually in accordance with the operation of the cooling device and prevents smooth flow of refrigerant flow, so that the filter plate needs be cleaned periodically. In the cooling device according to the above Publication which is formed in a integral laminated structure of many components including the filter plate, however, it is difficult to remove the filter plate from the laminated structure for cleaning.

The laminated structure is formed by bonding the components together by any suitable means. Furthermore, heat generators are joined to a plurality of heat transmission plates in the laminate structure by brazing or soldering, so that it is practically impossible to disassemble the components in the laminated structure. Therefore, the filter sheet in the cooling device according to the above Publication cannot be cleaned, so that it is not suitable for use for a long time.

The present invention is directed to providing a cooling device which facilitates the removal of foreign particles attached to a filter.

SUMMARY OF THE INVENTION

A cooling device includes a refrigerant inlet, a refrigerant outlet, a cooler including therein a refrigerant passage, an introduction tube communicating with the refrigerant inlet and a filter detachably disposed between the refrigerant inlet and the introduction tube.

Other aspects and advantages of the invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention together with objects and advantages thereof, may best be understood by reference to the following description of the presently preferred embodiments together with the accompanying drawings in which:

DETAILED DESCRIPTION OF THE PREFERRED EMBODIMENTS

Figure 1:
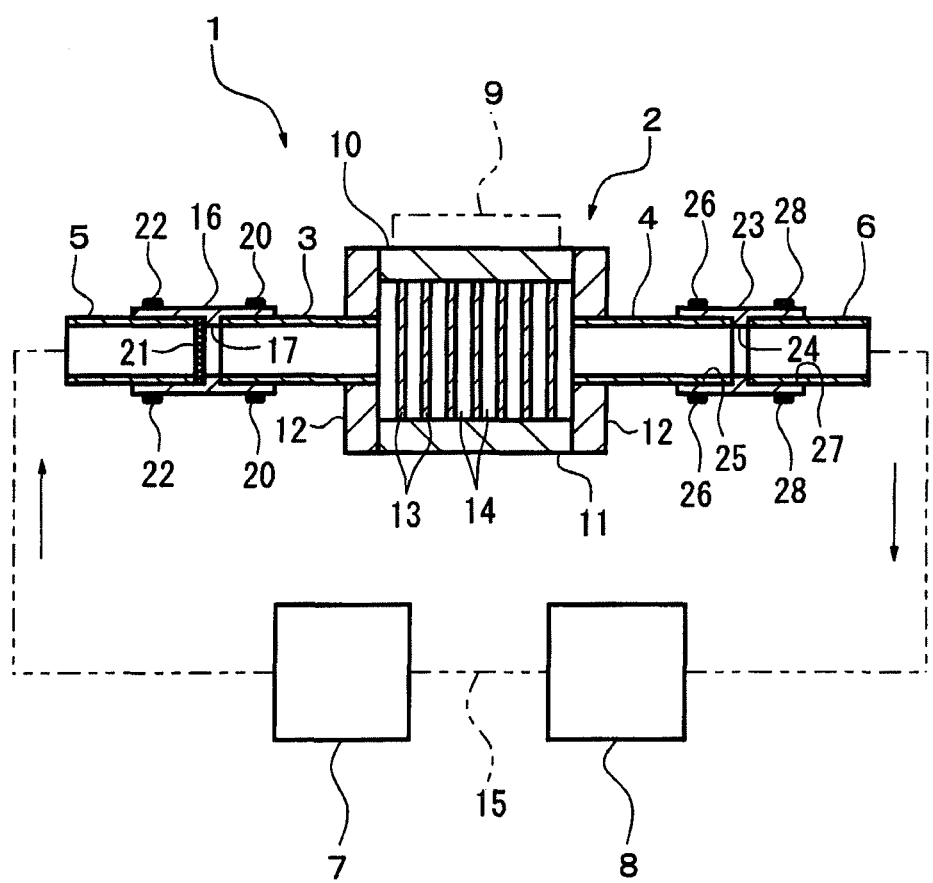
FIG. 1 is a partially cross sectional schematic view showing a cooling device according to a first embodiment.
Figure 2:
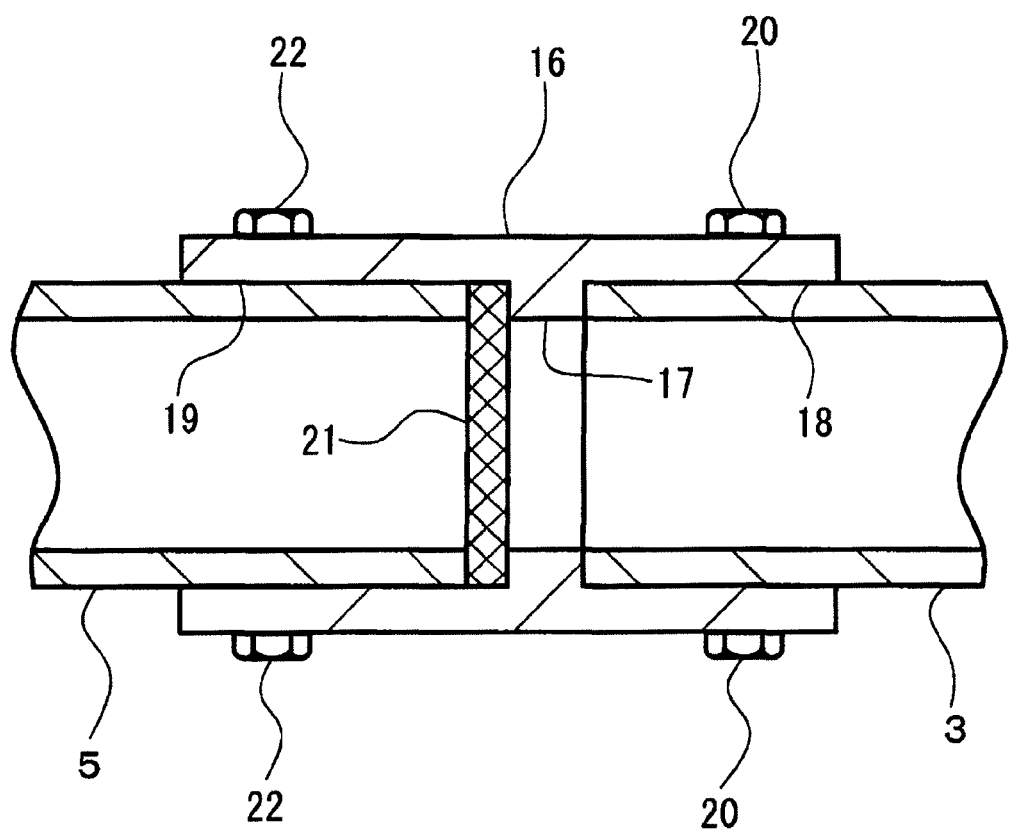
FIG. 2 is an enlarged cross sectional view showing the relation between a connector and a filter of the cooling device of FIG. 1.
Figure 3:
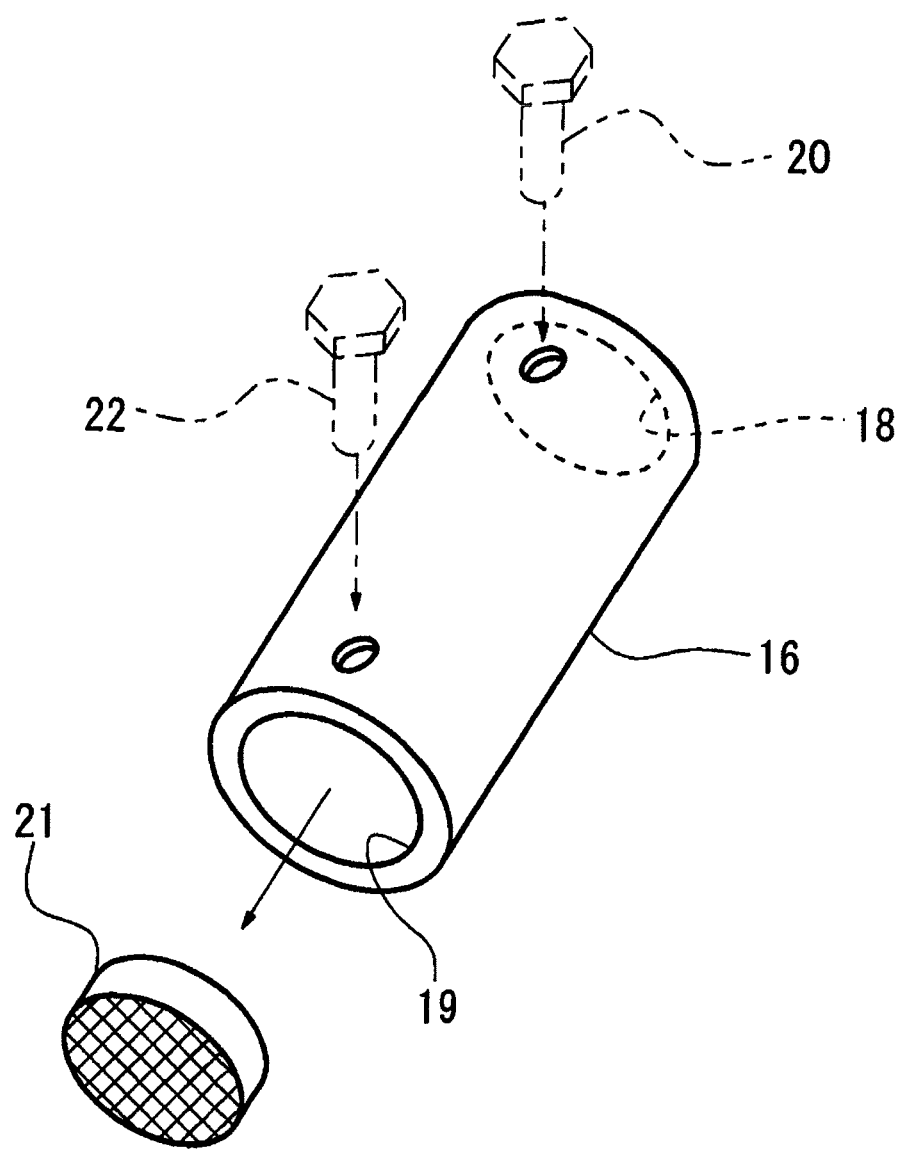
FIG. 3 is a perspective view describing a manner of cleaning the filter of the cooling device according to the first embodiment.

The following will describe the cooling device according to the first embodiment with reference to FIGS. 1 through 3. For the sake of convenience, the following description will be made with the drawing of FIG. 1 taken as a front view.

Referring to FIG. 1, the cooling device of the first embodiment is designated by 1. The cooling device 1 includes a cooler 2, an inlet tube 3, an outlet tube 4, an introduction tube 5, a delivery tube 6, a first connector 16, a second connector 23, a filter 21, a pump 7 and a radiator 8. An electric device formed by a heat generator 9 such as a semiconductor module including thermally-conducting material is joined to top surface of the cooler 2 by soldering.

The cooler 2 includes a top plate 10, a bottom plate 11 spaced from the top plate 10 at a predetermined distance, side plates 12 connecting outer peripheries of the top plate 10 and the bottom plate 11, a plurality of arrays of fins 13, the inlet tube 3 and the outlet tube 4 connected to the respective side plates. The top plate 10, the bottom plate 11 and the side plates 12 cooperate to form a housing as a part of the cooler 2 through which refrigerant flows. The arrays of fins 13 are provided extending between the top plate 10 and the bottom plate 11 and a refrigerant passage 14 is formed between any two adjacent arrays of fins 13 in the cooler 2. The top plate 10, the bottom plate 11, the side plates 12, the fins 13, the inlet tube 3 and the outlet tube 4 that form the cooler 2 are made of a metal containing mainly aluminum with high heat transference.

The inlet tube 3 is fixedly inserted through one side plate 12 of the cooler 2 for communicating with the refrigerant passage 14, forming a refrigerant inlet of the cooler 2. The outlet tube 4 is fixedly inserted through the other side plate 12 for communicating with the refrigerant passage 14, forming a refrigerant outlet of the cooler 2. The introduction tube 5 is connected to the pump 7 and the delivery tube 6 is connected to a radiator 8. The pump 7 and the radiator 8 are connected to each other through a tube 15.

As shown in FIG. 2, the inlet tube 3 and the introduction tube 5 are connected through the first connector 16. The first connector 16 is made of an annular tube having formed therein two large-diameter passages 18, 19 and an annular projection 17 projecting inward between the large-diameter passages 18, 19 and forming a small-diameter passage. That is, the large-diameter passages 18, 19 and the small-diameter passage are formed in the first connector 16 and refrigerant flows from the large-diameter passage 19 toward the large-diameter passage 18 through the center small-diameter passage. The inner diameters of the large-diameter passages 18, 19 are substantially the same as the outer diameters of the inlet tube 3 and the introduction tube 5, respectively. The outer diameters of the inlet tube 3 and the introduction tube 5 may be substantially the same. The inner diameter of the small-diameter passage formed by the projection 17 is substantially the same as the inner diameter of the inlet tube 3 and the introduction tube 5. The first connector 16 corresponds to a connector.

The inlet tube 3 is inserted in the large-diameter passage 18 of the first connector 16 on the downstream side thereof with respect to the refrigerant flowing direction. The inlet tube 3 is detachably fixed to the first connector 16 by a plurality of bolts 20 with the end surface of the inlet tube 3 in contact with downstream side surface of the projection 17. The introduction tube 5 is detachably fixed to the first connector 16 by a plurality of bolts 22 with the end surface of the introduction tube 5 in contact with a filter 21.

The filter 21 is formed in a cylindrical shape having an outer diameter that is substantially the same as the inner diameter of the large-diameter passage 19. The filter 21 is detachably inserted in the large-diameter passage 19 so that radially outer part of the end surface of the filter 21 on the downstream side thereof is in contact with upstream side surface of the projection 17. The filter 21 is made of a metal such as stainless steel, glass fiber, or a resin such as polyurethane and nylon. The filter 21 which is always exposed to refrigerant should preferably be made of any corrosion-resistant material. The mesh opening size of the filter 21 is smaller than the width of the refrigerant passage 14 defined by the arrays of fins 13 in the cooler 2, so that foreign particles in refrigerant can be captured by the filter 21 and the filter 21 prevents the refrigerant passage 14 from being clogged.

The second connector 23 has substantially the same structure as the first connector 16 and an annular projection 24 is formed at the center thereof. The second connector 23 connects the outlet tube 4 and the delivery tube 6 together. The outlet tube 4 is inserted in the large-diameter passage 25 of the second connector 23 on the upstream side thereof with respect to the refrigerant flowing direction. The outlet tube 4 is fixed to the second connector 23 by a plurality of bolts 26 with the end surface of the outlet tube 4 in contact with the upstream side surface of the projection 24. The delivery tube 6 is inserted in the large-diameter passage 27 of the second connector 23 on the downstream side thereof. The delivery tube 6 is fixed to the second connector 23 by a plurality of bolts 28 with the end surface of the delivery tube 6 in contact with downstream side surface of the projection 24. If the introduction tube 5 and the delivery tube 6 are made of a flexible material, assembling the introduction tube 5 and the delivery tube 6 to the first and the second connectors 16, 23, respectively can be facilitated.

The following will describe the operation and the advantageous effects of the cooling device 1 according to the first embodiment. Referring to FIG. 1, during the operation of the cooling device 1, refrigerant supplied from the pump 7 into the introduction tube 5 is filtered through the filter 21 and flows through the inlet tube 3 into the cooler 2. After foreign particles have been removed from refrigerant by the filter 21, refrigerant is exchanged heat with the heat generator 9 in the cooler 2 while passing through the refrigerant passage 14 and flows out to the outlet tube 4. Refrigerant discharged from the cooler 2 flows through the delivery tube 6 to the radiator 8 for being cooled. Refrigerant cooled in the radiator 8 flows through the tube 15 to the pump 7 which feeds refrigerant to the introduction tube 5 again. Thus, the cooler 2 cools the heat generator 9 by circulating refrigerant.

When the cooling device 1 operates for a given period of time, the filter 21 becomes clogged with foreign particles, so that the flow rate of refrigerator passing through the filter 21 decreases. In such a case, the operation of the cooling device 1 is stopped and the introduction tube 5 and the inlet tube 3 are removed from the first connector 16 by loosening the bolts 20, 22. As shown in FIG. 3, by inclining the first connector 16 with the upstream end thereof placed lower than the opposite end, the filter 21 can be removed from the first connector 16 easily. The filter 21 removed from the first connector 16 can be cleaned with water, so that foreign particles that are attached to the filter 21 can be removed easily. If the filter 21 is not removed from the first connector 16 only by inclining the first connector 16, a rod-like member may be inserted into the first connector 16 from the downstream end thereof to remove the filter 21.

The cooling device 1 can be restored by installing the cleaned filter 21 in place in the large-diameter passage 19 of the first connector 16 and subsequently connecting the inlet tube 3 and the introduction tube 5 to the first connector 16, as shown in FIGS. 1 and 2. Since the filter 21 can be cleaned periodically and easily, the cooler 2 can maintain smooth flow of refrigerant in the refrigerant passage 14 and permits efficient radiation of heat generated by the heat generator 9.

Figure 4:
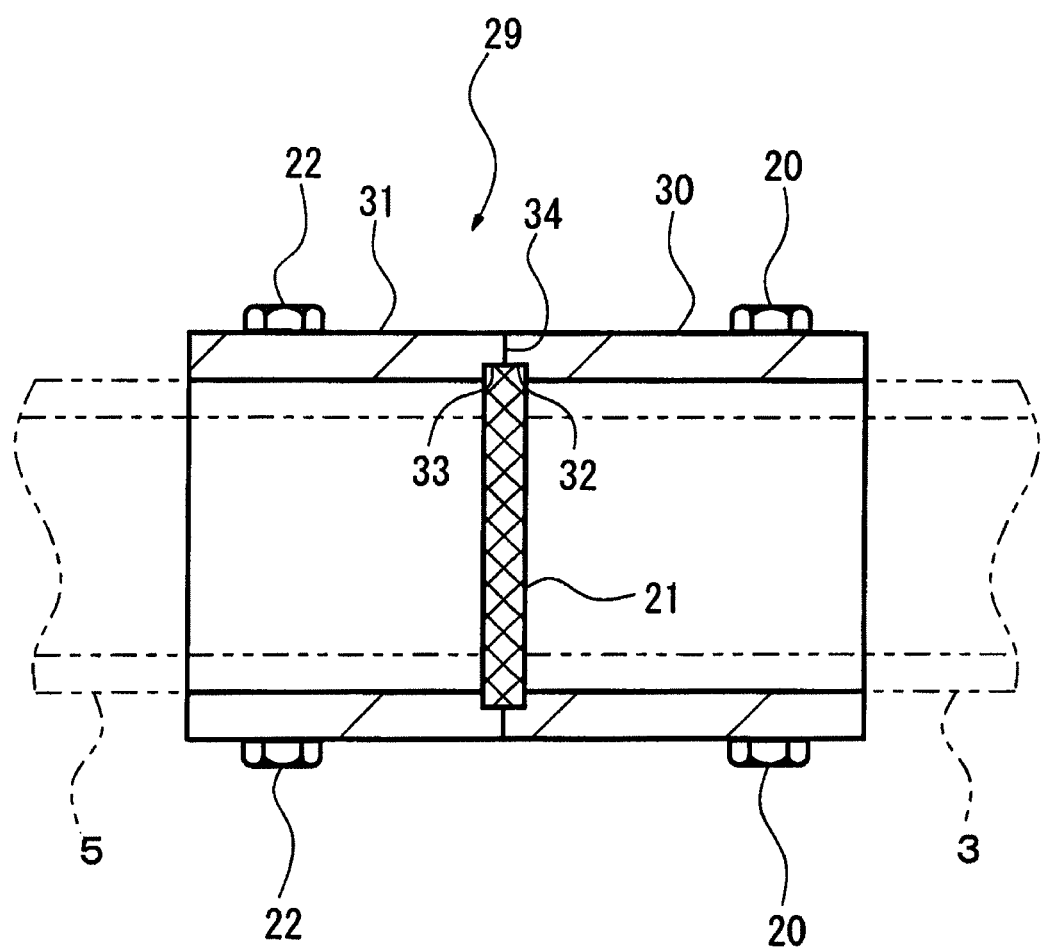
FIG. 4 is an enlarged partially cross sectional view showing the relation between a connector and a filter of a cooling device according to a second embodiment.
Figure 5:
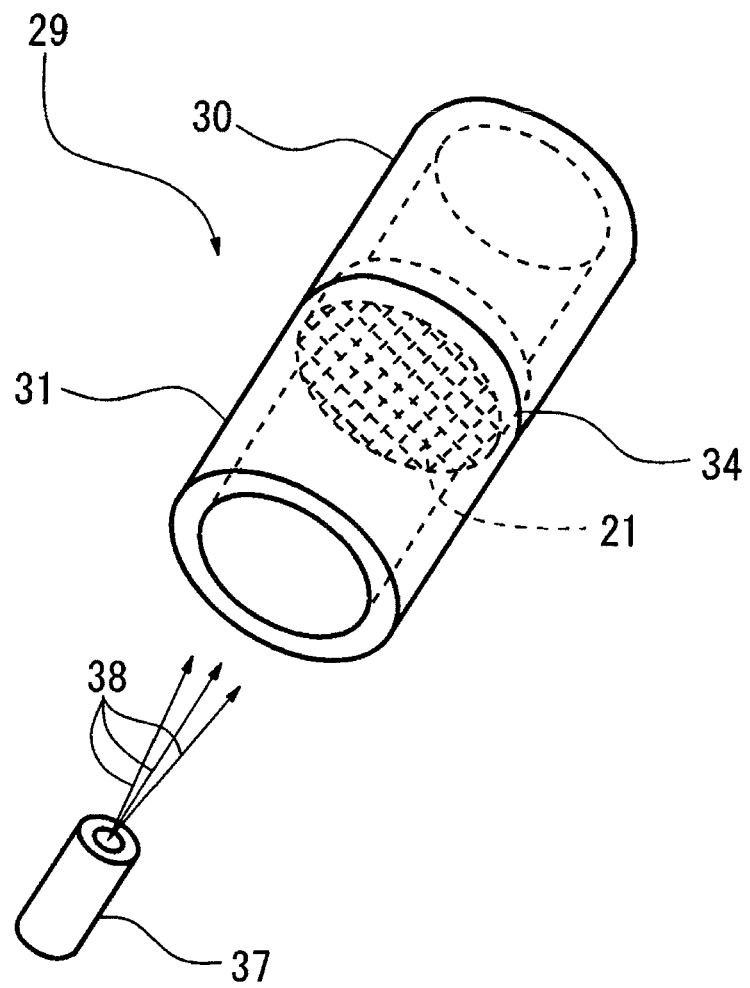
FIG. 5 is a perspective view describing a manner of cleaning the filter of the cooling device according to the second embodiment.

The following will describe the cooling device according to the second embodiment with reference to FIGS. 4 and 5. The cooling device of the second embodiment differs from that of the first embodiment in the manner of installation of the filter. The following description will use the same reference numerals for the common elements or components in the first and the second embodiments and the description of such common elements or components will be omitted.

As shown in FIG. 4, the connector 29 connecting the inlet tube 3 and the introduction tube 5 is formed by a pair of annular tubes 30, 31 that are joined together in an end-to-end manner and have an inner diameter that is substantially the same as the outer diameter of the inlet tube 3 or the introduction tube 5. Annular grooves 32, 33 are formed in the joined end surfaces of the tubes 30, 31 on the radially inner side, respectively. The tubes 30, 31 are joined together by brazing filler metal 34 with the filter 21 fitted at the outer periphery thereof in the annular grooves 32, 33. The tubes 30, 31 may be detachably joined together mechanically by any other suitable fastening means such as bolts. Thus, the tubes 30, 31 and the filter 21 are integrally formed into the connector 29.

The inlet tube 3 is inserted into the tube 30 and fixed by bolts 20 with the end surface of the inlet tube 3 in contact with the end surface of the filter 21 on the downstream side thereof with respect to the refrigerant flowing direction. Similarly, the introduction tube 5 is inserted into the tube 31 and fixed by bolts 22 with end surface of the introduction tube 5 in contact with the other end surface of the filter 21 on the upstream side thereof. The filter 21 is thus interposed between the inlet tube 3 and the introduction tube 5 and refrigerant is filtered in stable condition.

The filter 21 is cleaned as follows. The inlet tube 3 and the introduction tube 5 are removed from the connector 29 by loosening the bolts 20, 22. As shown in FIG. 5, the foreign particles attached to the end surface of the filter 21 on its upstream side can be removed by directing a hose 37 that is connected to a washing device (not shown) toward the inside of the tube 31 and injecting cleaning liquid 38 such as water. Similarly, the foreign particles deposited in the filter 21 can be removed easily by directing the hose 37 toward the inside of the tube 30 and injecting cleaning liquid 38. Thus, the filter 21 can be cleaned entirely and easily.

The present invention is not limited to the above embodiments. The present invention may be practiced in various ways within the scope of the present invention, as exemplified below.

(1) The filter 21 of the first embodiment may be inserted into the first connector 16 between the inlet tube 3 and the end surface of the projection 17 on the downstream side thereof.

(2) In the first embodiment, as far as the filter 21 can be installed in the first connector 16, the respective inner diameters of the inlet tube 3, the introduction tube 5 and the small-diameter passage of the projection 17 may differ from each other.

(3) According to the present invention, refrigerant inlet of the cooler 2 may not necessarily be formed by an inlet tube such as 3 in the first embodiment, but it may be formed by a hole formed through the side plate 12 of the cooler 2. In this case, the filter 21 is detachably provided in the hole of the side plate 12 and the first connector 16 of the first embodiment may be connected to the hole directly and the introduction tube 5 may be connected to the first connector 16. Alternatively, the first connector 16 may be dispensed with and the introduction tube 5 may be connected directly to the hole of the side plate 12.

(4) The first and the second connectors 16, 23 of the first embodiment may be of click-type so that the inlet tube 3 and the introduction tube 5, the outlet tube 4 and the delivery tube 6 are connectable to the first and second connectors 16, 23 only by inserting the respective tubes into the first and second connectors 16, 23. The means for fixing the inlet tube 3, the introduction tube 5, the outlet tube 4 and the delivery tube 6 to the connectors 16, 23, 29 according to the present invention is not limited to bolts or the above click-on type connection. For example, the inlet tube 3, the introduction tube 5, the outlet tube 4 and the delivery tube 6 may be made of a flexible material and fixed to the connectors 16, 23, 29 by any suitable fixing means such as a hose clip.

(5) The means for fixing the filter 21 in the connector 29 in the second embodiment is not limited to the structure as shown in FIG. 4. The filter 21 may be inserted into a single tube and fixed with adhesive.

(6) The cooling device 1 according to the present invention may be applied not only for cooling the semiconductor module, but also for cooling any other heat generators forming electric device. The cooling device according to the present invention may be used for cooling electric devices for various kinds of equipment other than a vehicle.

What is claimed is:

1. A semiconductor device comprising:
   a cooler including a refrigerant passage, a refrigerant inlet and a refrigerant outlet;
   an introduction tube communicating with the refrigerant inlet; and
   a filter detachably disposed between the refrigerant inlet and the introduction tube, wherein
   a connector connects the refrigerant inlet and the introduction tube,
   the filter is provided in the connector,
   the cooler includes a top plate, a bottom plate and side plates,
   a plurality of fins are provided between the top plate and the bottom plate, and
   a heat generator is thermally joined to the top plate.

2. The semiconductor device according to claim 1, further comprising:
   an inlet tube fixed to the cooler, wherein
   the inlet tube defines the refrigerant inlet.

3. The semiconductor device according to claim 1, wherein the filter is detachably disposed in the connector.

4. The semiconductor device according to claim 1, wherein
   the introduction tube and the refrigerant inlet are detachably provided in the connector, and
   the filter is fixed to the connector.

5. The semiconductor device according to claim 1, wherein the connector includes:
   a plurality of large-diameter passages;
   an annular projection that is provided between the plurality of large-diameter passages in the connector and projects inwardly; and
   a small-diameter passage that is defined by the annular projection and communicates with the plurality of large-diameter passages, wherein
   the filter is interposed between an upstream side surface of the projection and a downstream end surface of the introduction tube with respect to a flowing direction of refrigerant.

6. The semiconductor device according to claim 1, wherein the connector includes:
   a plurality of tubes that are joined together in an end-to-end manner and have annular grooves provided in joined end surfaces of the tubes on a radially inner side of the tubes, respectively, wherein
   when the plurality of tubes are joined together, the filter is fitted in the annular grooves at an outer periphery of the filter.

7. The semiconductor device according to claim 1, wherein the cooler includes:
   a fin that defines the refrigerant passage in the cooler, wherein
   a mesh opening size of the filter is smaller than a width of the refrigerant passage.

\* \* \* \* \*